US011695397B2

(12) United States Patent
Zhang et al.

(10) Patent No.: US 11,695,397 B2
(45) Date of Patent: Jul. 4, 2023

(54) OFFSET CIRCUITRY AND THRESHOLD REFERENCE CIRCUITRY FOR A CAPTURE FLIP-FLOP

(71) Applicant: XILINX, INC., San Jose, CA (US)

(72) Inventors: Wenfeng Zhang, San Jose, CA (US); Parag Upadhyaya, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/398,675

(22) Filed: Aug. 10, 2021

(65) Prior Publication Data

US 2023/0050659 A1  Feb. 16, 2023

(51) Int. Cl.
| | | |
|---|---|---|
| H03K 5/003 | (2006.01) | |
| H03K 3/037 | (2006.01) | |
| H04B 1/16 | (2006.01) | |
| H04L 27/32 | (2006.01) | |

(52) U.S. Cl.
CPC ............. *H03K 5/003* (2013.01); *H03K 3/037* (2013.01); *H04B 1/16* (2013.01); *H04L 27/32* (2013.01)

(58) Field of Classification Search
CPC ...................................................... H03K 5/003
USPC .......................................................... 375/316
See application file for complete search history.

(56) References Cited

U.S. PATENT DOCUMENTS

| | | | | |
|---|---|---|---|---|
| 6,809,970 | B2* | 10/2004 | Mazumder | G11C 5/147 365/207 |
| 11,018,845 | B1* | 5/2021 | Liu | H04L 25/03063 |
| 2015/0116299 | A1* | 4/2015 | Hekmat | H04L 25/03057 345/212 |
| 2020/0213165 | A1 | 7/2020 | Iyer et al. | |
| 2022/0149863 | A1* | 5/2022 | Ko | H04L 25/03006 |

FOREIGN PATENT DOCUMENTS

WO       2016140743 A1    9/2016

OTHER PUBLICATIONS

Yonar, Abdullah Serdar, et al., "An In-Comparator Aperture-Time Equalization in a 7-nm FinFET CMOS 40-GB/s Receiver", IEEE Solid-State Circuits Letters, vol. 3, 2020.

Krupnik, Yoel, "112-Gb/s PAM4 ADC-Based SERDES Receiver With Resonant AFE for Long-Reach Channels", IEEE Journal of Solid-State Circuits, vol. 55, No. 4., Apr. 2020.

* cited by examiner

*Primary Examiner* — Lihong Yu (74) *Attorney, Agent, or Firm* — Patterson + Sheridan, LLP (57) ABSTRACT

Receiver circuitry for a communication system includes signal processing circuitry, voltage digital-to-analog converter (DAC) circuitry, and slicer circuitry. The signal processing circuitry receives a data signal and generate a processed data signal. The voltage DAC circuitry generates a first threshold reference voltage. The slicer circuitry is coupled to an output of the signal processing circuitry. The slicer circuitry includes a capture flip-flop (CapFF) circuit that receives the processed data signal and the first threshold reference voltage. The CapFF circuit further generates a first data signal. The first CapFF circuit includes a first offset compensation circuit that adjusts a parasitic capacitance of the first CapFF circuit.

17 Claims, 7 Drawing Sheets

OFFSET CIRCUITRY AND THRESHOLD REFERENCE CIRCUITRY FOR A CAPTURE FLIP-FLOP

TECHNICAL FIELD

Examples of the present disclosure generally relate to correcting offset within a capture flip-flop and providing reference voltages to the capture flip-flop.

BACKGROUND

Receivers commonly include slicer circuitry that processes received input signals and generates corresponding data signals. Offset compensation is applied to the slicer circuitry to correct for any mismatches within the slicer circuitry. The mismatches may be due to differences in the circuit elements and routing that occur based on manufacturing and process tolerances. The slicer circuitry includes one or more slices that generates the data signals based on threshold reference voltages. To compensate for mismatches within the slicer circuitry, the threshold reference voltages are adjusted before it is provided to the slicers of the slicer circuitry. For example, the threshold reference voltages are adjusted by a current to voltage circuit and then output to the slicer circuitry. The threshold reference voltages are adjusted to compensate for mismatch within the slicer circuitry external to the slicer circuitry. Accordingly in slicer circuitry that includes more than one slicer, the threshold reference voltage for each slicer is adjusted independently from each other before being communicated to the slicer circuitry.

Receiver circuitry of a pulse amplitude modulation 4-level (PAM4) receiver includes data slicer circuitry and error slicer circuitry. The data slicer circuitry includes three data slicers per clock phase to detect four data levels (e.g., 00, 01, 10, and 11). Each of the data slicers corresponds to a respective one of a DH (a high data latch voltage) threshold, DZ (a middle data latch voltage) threshold, and DL (a low data latch voltage) threshold. Accordingly, for four clock phases, the data slicer circuitry includes twelve data slicers. Further, for offset compensation and threshold level adaptions within the receiver circuitry, the error slicer circuitry includes one error slicer per clock phase. A first error slicer detects a voltage level EHP (a positive error latch voltage with a high voltage magnitude), a second error slicer detects a voltage level ELP (a positive error latch voltage with a low voltage magnitude), a third error slicer detects a voltage level EHN (a negative error latch voltage with a high voltage magnitude), and a fourth error slicer detects a voltage level ELN (a negative error latch voltage with a low voltage magnitude). Accordingly, receiver circuitry that uses four clock phases has 16 total slicers (e.g., 12 data slicers and 4 error slicers).

Each of the slicers (e.g., data slicers and error slicers) receives a corresponding threshold reference voltage. Further, offset compensation is applied to each of the threshold reference voltages to compensate for mismatch within the slicers before being communicated to the slicers. Accordingly, for two different slicers that share a threshold reference voltage, the threshold reference voltage provided to each slicer is independently adjusted to compensate for mismatch in each slicer. In receiver circuitry including 16 slicers, 16 threshold reference voltages are generated and compensated, increasing the circuit area and power requirements of the receiver circuitry.

SUMMARY

The receiver circuitry disclosed herein includes slicer circuitry with one or more slicers. Each slicer includes a capacitor digital-to-analog converter (CDAC) circuit that performs offset compensation within the corresponding slicer. The slicers generate output data signals from an input signal based on a threshold reference voltage. The threshold reference voltages for the slicers are generated by a voltage digital-to-analog converter (DAC) circuit. Further, in examples were the slicer circuitry includes multiple slicers, one or more threshold reference voltage values may be shared between two or more slicers as the offset compensation is occurring within each slicer. Accordingly, the power and circuit area overhead of the corresponding receiver circuitry are reduced as compared to receiver circuitry that does not employ a CDAC circuit for offset compensation and/or a voltage DAC circuit for generating the reference voltage levels.

In one example, receiver circuitry for a communication system includes signal processing circuitry, voltage digital-to-analog converter (DAC) circuitry, and slicer circuitry. The signal processing circuitry is configured to receive a data signal and generate a processed data signal. The voltage DAC circuitry is configured to generate a first threshold reference voltage. The slicer circuitry is coupled to an output of the signal processing circuitry. The slicer circuitry includes a capture flip-flop (CapFF) circuit configured to receive the processed data signal and the first threshold reference voltage. The CapFF circuit is further configured to generate a first data signal. The first CapFF circuit includes a first offset compensation circuit configured to adjust a parasitic capacitance of the first CapFF circuit.

In one example, a communication system includes transmitter circuitry and receiver circuitry. The transmitter circuitry is configured to transmit a data signal. The receiver circuitry is connected to the transmitter circuitry via a channel. The receiver circuitry includes signal processing circuitry, voltage digital-to-analog converter (DAC) circuitry, and slicer circuitry. The signal processing circuitry is configured to receive the data signal and generate a processed data signal. The voltage DAC circuitry is configured to generate a firth threshold reference voltage. The slicer circuitry is coupled to an output of the signal processing circuitry. The slicer circuitry comprises a first capture flip-flop (CapFF) circuit. The first CapFF circuit is configured to receive the processed data signal and the first threshold reference voltage and generate a first data signal. The first CapFF circuit comprises a first offset compensation circuit configured to adjust a parasitic capacitance of the first CapFF circuit.

In one example, a method for operating receiver circuitry includes receiving a data signal and generating a processed data signal from the data signal, and generating, via a voltage-to-analog convertor (DAC) circuitry, a first threshold reference voltage. The method further includes receiving, at a first CapFF circuit the processed data signal and the first threshold reference voltage, and adjusting, via a first offset compensation circuit of the first CapFF circuit, a parasitic capacitance of the first CapFF circuit. Further, the method include generating an output signal from the processed data signal.

These and other aspects may be understood with reference to the following detailed description.

BRIEF DESCRIPTION OF THE DRAWINGS

So that the manner in which the above-recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Receiver circuitry disclosed herein for a receiver of a transceiver includes slicer circuitry that detects a voltage level of an input signal. Example slicer circuitry includes data slicer circuitry and error slicer circuitry. The data slicer circuitry includes one or more data slicers and the error slicer circuitry includes one or more error slicers. Each slicer detects an associated voltage from an input data signal. A slicer may also be referred to as a capture flip-flop (CapFF) circuit. The CapFF circuit detects the voltage level of the input signal based a threshold reference voltage. The threshold reference voltage is selected such that the CapFF circuit is able to detect a corresponding voltage level. Further, each CapFF circuit has a corresponding offset compensation circuit to compensate for mismatches within the CapFF circuit. Accordingly, offset compensation is applied to each CapFF circuit independently from each other CapFF circuit. The mismatches within a CapFF circuit are attributed to differences in the circuit elements and routing elements of the CapFF circuit due to manufacturing and/or process tolerances. In one example, the offset compensation circuit for each CapFF circuit is a capacitor digital-to-analog converter (CDAC). As the offset compensation for each CapFF circuit occurs within each CapFF circuit, the threshold reference voltages applied to the CapFF circuit are not adjusted to compensate for mismatches within the CapFF circuits. Accordingly, the threshold reference voltage for each CapFF circuit may be provided by a voltage digital-to-analog converter (DAC) circuit. Performing offset compensation for each CapFF circuit with a respective offset compensation circuit and generating the threshold reference voltages with a voltage DAC circuit, reduces the power requirements and circuit area overhead of the corresponding receiver circuitry as compared to other receiver circuitry designs.

In one example, the receiver circuitry includes data slicer circuitry and error slicer circuitry. The data slicer circuitry includes one or more data slicers and the error slicer circuitry includes one or more error slicers. For example, the receiver circuitry is a pulse amplitude modulation 4-level (PAM4) receiver. In a PAM4 receiver, the data slicer circuitry includes three data slicers per clock phase to detect the four data levels (e.g., 00, 01, 10, and 11) associated with 4-level amplitude modulation. Each of the data slicers corresponds to a respective one of a DH (a high data latch voltage) threshold, DZ (a middle data latch voltage) threshold, and DL (a low data latch voltage) threshold. Accordingly, for four clock phases, the receiver circuitry includes twelve data slicers. Further, the receiver circuitry includes an error slicer for each clock phase. For example, for four clock phases, the receiver circuitry includes a first error slicer that detects a voltage level EHP (a positive error latch voltage with a high voltage magnitude), a second error slicer that detects a voltage level ELP (a positive error latch voltage with a low voltage magnitude), a third error slicer that detects a voltage level EHN (a negative error latch voltage with a high voltage magnitude), and a fourth error slicer that detects a voltage level ELN (a negative error latch voltage with a low voltage magnitude). Accordingly, for four clock phases, the receiver circuitry includes four error slicers. In total, a receiver circuitry that uses four clock phases has 16 total slicers (e.g., 12 data slicers and 4 error slicers). While PAM4 is described in the above, in other examples, the receiver circuitry may be a PAM-N receiver, where N is 2 or more.

In another example, the receiver circuitry is a binary non-return-to zero (NRZ) receiver. As with a PAM4 receiver, an NRZ receiver includes one or more slicers (e.g., data and/or error slicers) with corresponding threshold voltages.

Each data and error slicer is a CapFF circuit with a corresponding offset compensation circuit that performs localized compensation within each slicer. Further, a voltage DAC circuit provides the threshold reference voltage for each slicer. Accordingly, as compared to receivers (e.g., PAM-N receivers or NRZ receivers, among others) that do not perform localized offset compensation for each slicer with a respective offset compensation circuit and generate the threshold reference voltages with a voltage DAC circuit, the power and circuit area overhead of the receiver circuitry as described above is reduced. For example, the above described receiver circuitry omits the DAC-FARM circuit and current to voltage (I2V) circuit used in other receiver circuitry designs for offset compensation and threshold reference voltage generation, instead of using power and circuit area reducing circuit elements (e.g., CDAC circuits and voltage DAC circuits).

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Figure 1:
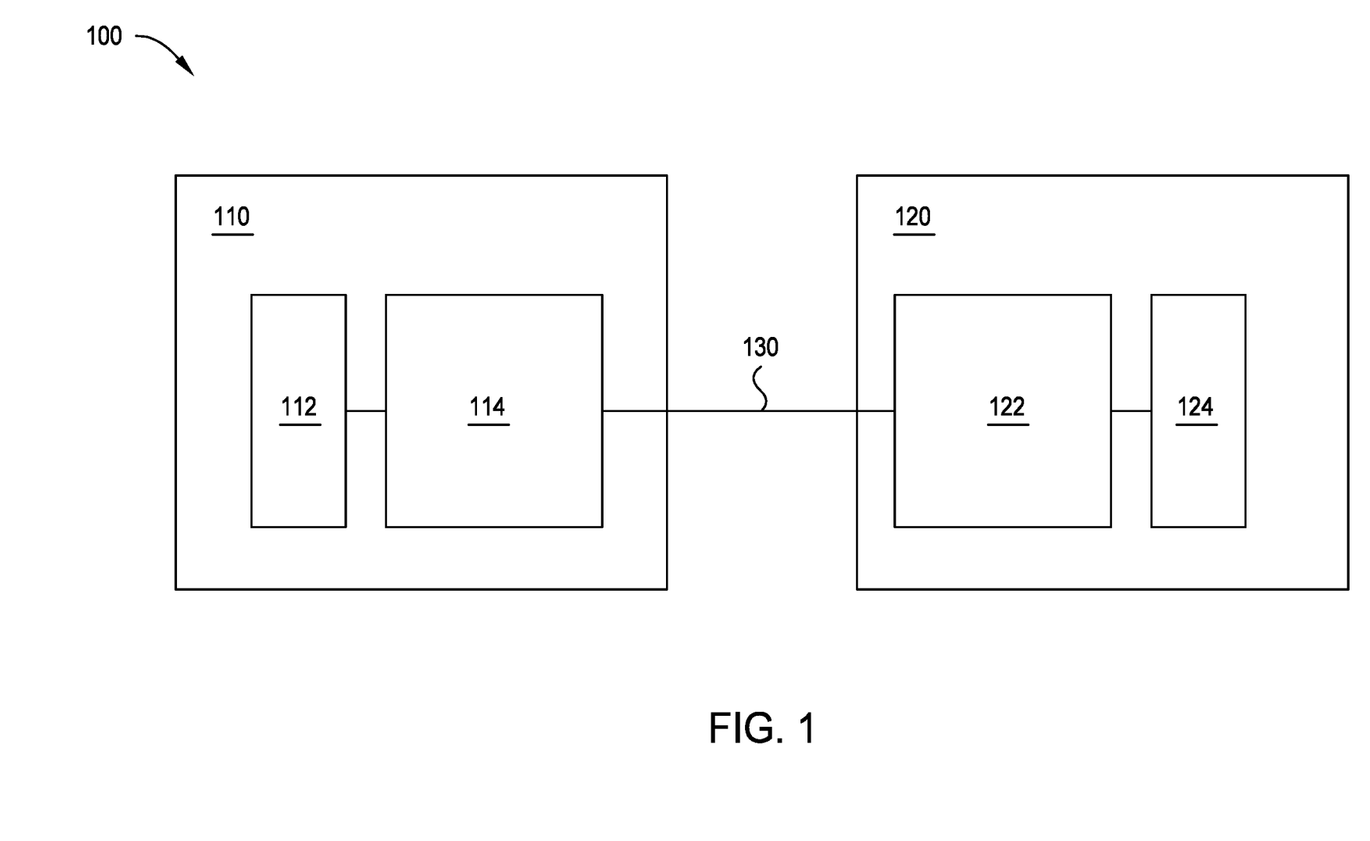
FIG. 1 is a block diagram depicting an example communication system, according to an example.

FIG. 1 illustrates a block diagram of a communication system 100, according to one or more examples. The communication system 100 includes a serializer/deserializer (SerDes) 110 and a SerDes 120. The SerDes 110 is communicatively coupled to the SerDes 120 via a channel 130. The channel 130 may include one or more traces (routings). For example, the channel 130 may include two traces and may be a differential communication channel. The SerDes 110 and the SerDes 120 may be part of one or more integrated circuits (ICs), such as one or more application specific ICs (ASICs) or one or more programmable ICs (e.g., a field programmable gate array (FPGA).

The SerDes 110 includes parallel-in-serial-out (PISO) circuitry 112 and transmitter circuitry 114. In various examples, the SerDes 110 includes additional circuit elements. For example, the SerDes 110 may include receiver circuitry and corresponding circuit elements. Further, the SerDes 110 may include signal processing circuitry (e.g., encoder circuitry or decoder circuitry, among others). The PISO circuitry 112 converts parallel input data to serial output data for transmission by the transmitter circuitry 114 over the channel 130.

The SerDes 120 includes receiver circuitry 122 and serial-in-parallel-out (SIPO) circuitry 124. The SerDes 120 may include additional circuit elements not illustrated in FIG. 1. For example, the SerDes 120 may include transmitter circuitry and/or signal processing circuitry (e.g., encoder circuitry or decoder circuitry, among others). The receiver circuitry 122 receives a signal from the transmitter circuitry 114 via the channel 130. Further, the receiver circuitry 122 processes the received signal and outputs an output signal to the SIPO circuitry 124. The output signal is a serial data signal. The SIPO circuitry 124 converts the serial data signal received from the receiver circuitry 122 to parallel output data.

While the communication system 100 is illustrated as including the SerDes 110 and the SerDes 120, in other examples, the transmitter circuitry 114 and/or the receiver circuitry 122 may be stand-alone circuit elements. Further, the transmitter circuitry 114 and the receiver circuitry 122 may be part of one or more ICs, such as one or more ASICS or one or programmable ICs.

Figure 2:
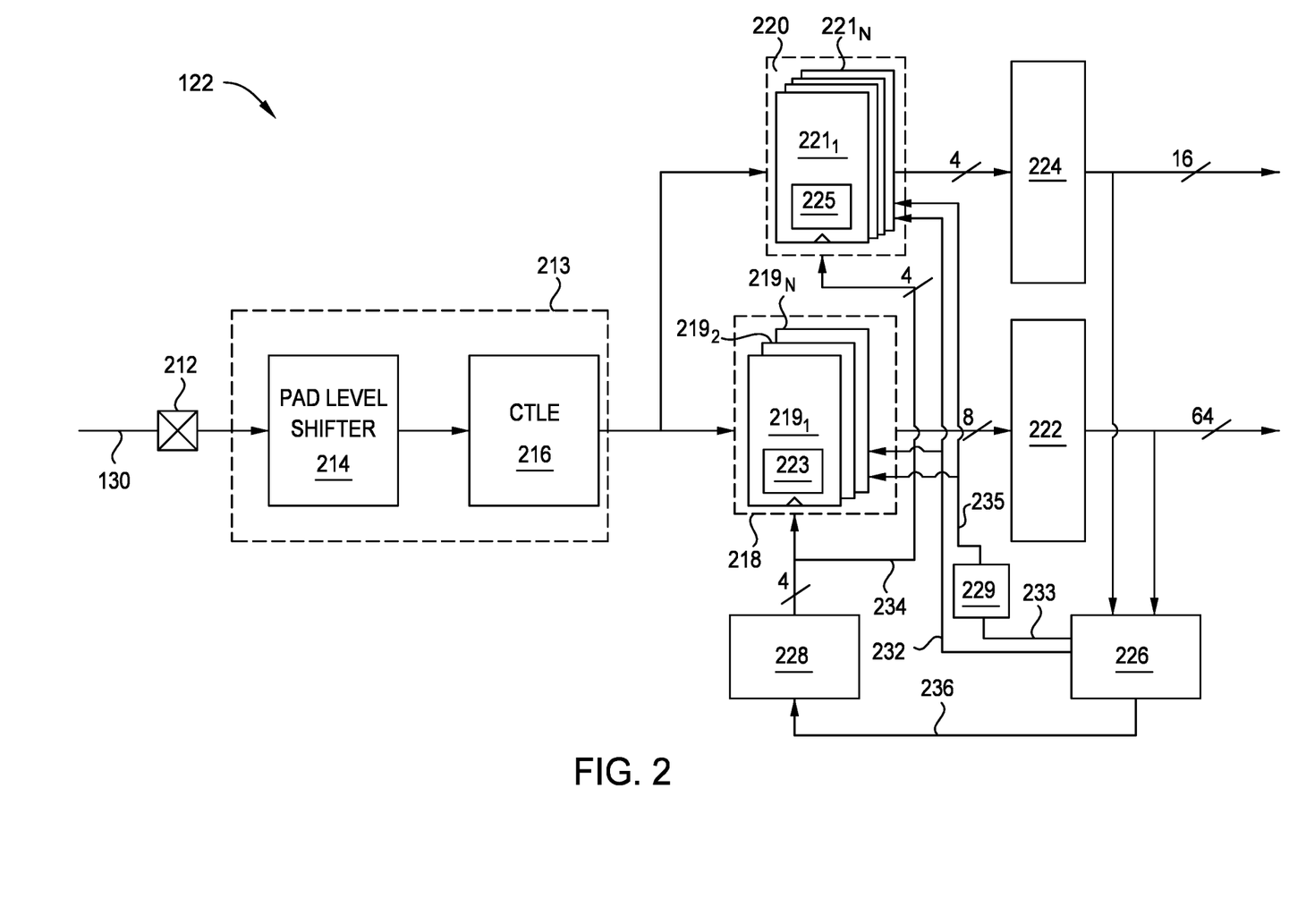
FIG. 2 is a block diagram depicting example receiver circuitry, according to an example.

FIG. 2 illustrates a schematic block diagram of the receiver circuitry 122, according to one or more examples. In one example, the receiver circuitry 122 is a multi-level receiver. For example, the receiver circuitry 122 may be a pulse amplitude modulation 4-level (PAM4) receiver and receives and processes a data signal having four levels. Further, in one or more examples, the receiver circuitry 122 receives and processes a data signal having less than or more than four levels. In other examples, the receiver circuitry 122 is an NRZ receiver that receives and processes a data signal having two levels.

In the example of FIG. 2, the receiver circuitry 122 includes input pad 212, level shifter circuitry 214, continuous time linear equalizer (CTLE) circuitry 216, data slicer circuitry 218, error slicer circuitry 220, deserializer circuitry 222, 224, clock and data-recovery (CDR) adaptation circuitry 226, clock generator circuitry 228, and voltage DAC circuitry 229.

A signal transmitted from transmitter circuitry (e.g., the transmitter circuitry 114) is received at the input pad 212 via the channel 130. The level shifter circuitry 214 is connected to the input pad 212 and adjusts the voltage level of the received signal to be within the operating parameters of the CTLE circuitry 216. The CTLE circuitry 216 is connected to the level shifter circuitry 214. The CTLE circuitry 216 operates as a high-pass filter or a band-pass filter to compensate for the low-pass characteristics of the channel 130. The level shifter circuitry 214 and the CTLE circuitry 216 form at least part of the signal processing circuitry 213.

The CTLE circuitry 216 outputs an equalized analog signal to the data slicer circuitry 218 and the error slicer circuitry 220. Each data slicer of the data slicer circuitry 218 detects a voltage level within the equalized analog signal associated with a corresponding threshold voltage. Further, each error slicer of the error slicer circuitry 220 detects a voltage level within the equalized analog signal associated with a corresponding threshold reference. In a PAM4 receiver, the data slicer circuitry 218 detects one or more data levels within the equalized analog signal associated with threshold references DH, DZ, and DL. The threshold references DH, DZ, and DL are each associated with a respective data threshold voltage. With reference to the eye diagram 300 of FIG. 3, the threshold reference DH corresponds to a data threshold voltage DH 306, the threshold reference DZ corresponds to a data threshold voltage DZ 304, and the threshold reference DL corresponds to a data threshold voltage DL 302. The voltage level of data threshold voltage DL 302 is less than the voltage level of data threshold voltage DZ 304, and the voltage level of data threshold voltage DZ 304 is less than the voltage level of data threshold voltage DH 306. In a NRZ receiver (or a receiver that detects less than four voltage levels), a first data slicer is associated with a first data threshold voltage and a second data slicer is associated with a second data threshold voltage. The second data threshold voltage has a voltage level less than the first data threshold voltage. Accordingly, the first data slicer detects a data level (e.g., voltage level) having a voltage level higher than the data level detected by the second data slicer.

Figure 3:
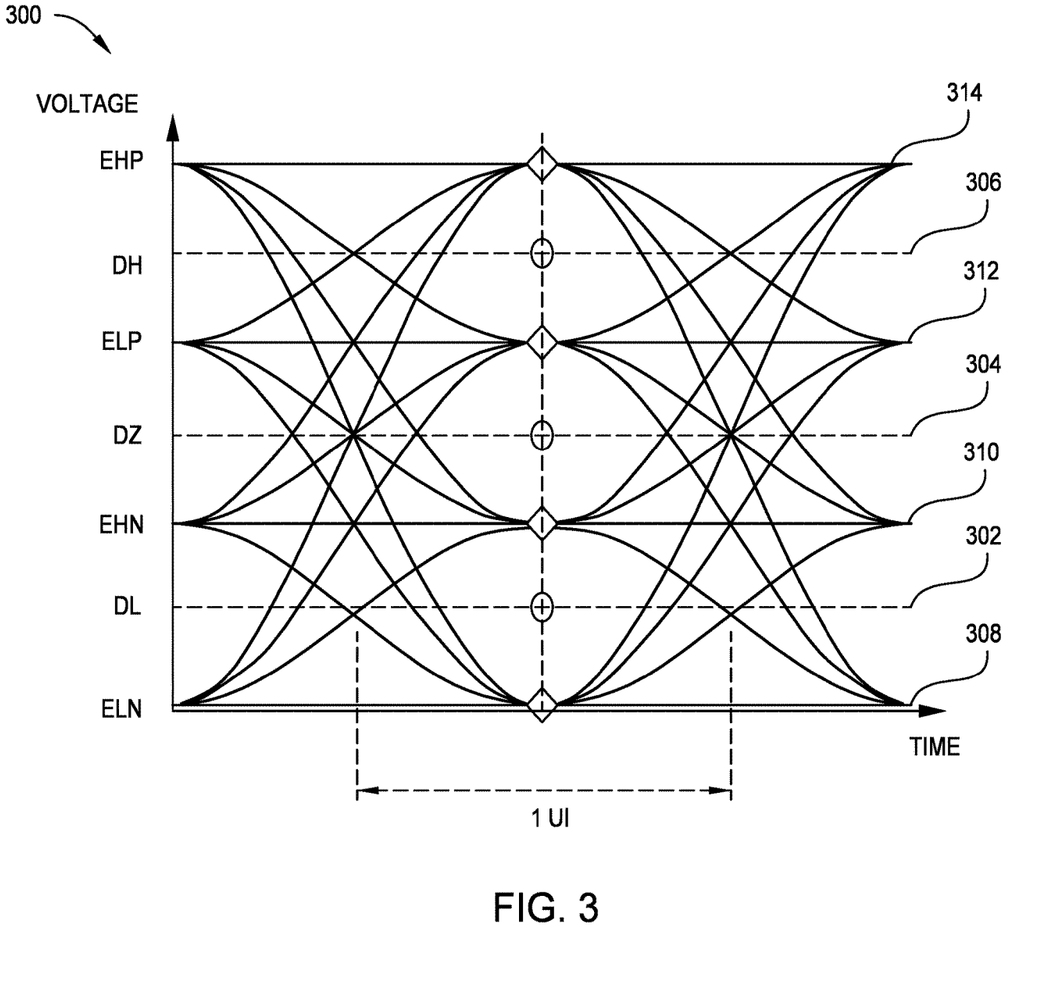
FIG. 3 is an example eye diagram for receiver circuitry, according to an example.

FIG. 3 illustrates an exemplary eye diagram for a PAM-4 signaling scheme. In a four level signaling scheme, such as PAM-4, the voltage (e.g., transmitted data signal) on a signal conductor (e.g., the channel 130) takes one of four values of increasing voltage. For example, the voltage may take a first value, error voltage value ELN 308, a second value, the error voltage value EHN 310, a third value, the error voltage value ELP 312, or a fourth value, the error voltage value EHP 314. As illustrated in FIG. 3, the error voltage value ELN 308 is less than the error voltage value EHN 310, the error voltage value EHN 310 is less than the error voltage value ELP 312, and the error voltage value ELP 312 is less than the error voltage value EHP 314. In one example, the magnitude of the error voltage value EHP 314 and the error voltage value EHN 310 are similar (e.g., within manufacturing tolerances, circuit related tolerances, and/or signal processing tolerances with each other, or within about 5 percent to about 10 percent with each other). Further, the magnitude of the error voltage value ELP 312 and the error voltage value ELN 308 are similar (e.g., within manufacturing tolerances, circuit related tolerances, and/or signal processing tolerances with each other, or within about 5 to about 10 percent with each other). Further, in one example, the error voltage value EHP 314 and the error voltage value ELP 312 are positive voltages and the error voltage value EHN 310 and the error voltage value ELN 308 are negative voltages. The error voltage value EHP 314 and the error voltage value ELP 312 may have a positive value with reference to the data threshold voltage DZ 304, and the error voltage value EHN 310 and the error voltage value ELN 308 may have a negative value with reference to the data threshold voltage DZ 304.

The data threshold voltage DL 302 is between the error voltage value ELN 308 and the error voltage value EHN 310. The data threshold voltage DZ 304 is between the error voltage EHN 310 and the error voltage value ELP 312. The data threshold voltage DH 306 is between the error voltage value ELP 312 and the error voltage value EHP 314.

With further reference to FIG. 2, the data slicer circuitry 218 includes data slicers $219_1$-$219_N$. N is two or more. In one example, each of the data slicers $219_1$-$219_N$ detects a respective one of the threshold references DH, DZ, and DL.

The data slicer circuitry 218 receives the clock signal 234 from the clock generator circuitry 228. For each phase of the clock signal 234, a first data slicer is associated with threshold reference DH and outputs a first data signal by sampling the equalized analog signal, a second data slicer is associated with threshold reference DZ and outputs a second data signal by sampling the equalized analog signal, and a third data slicer circuit is associated with threshold reference DL and outputs a third data signal by sampling the equalized analog signal. Each of the first, second, and third data signals may correspond to one or more data bits.

Each of the data slicers $219_1$-$219_N$ receives a corresponding phase of the clock signal 234. For example, a first phase of the clock signal 234 is provided to a first three of the data slicers, a second phase of the clock signal 234 is provided to a second three of the data slicers, a third phase of the clock signal 234 is provided to a third three of the data slicers, and a fourth phase of the clock signal 234 is provided to a fourth three of the data slicers. In one example, the first phase is 0 degrees, the second phase is 90 degrees, the third phase is 180 degrees, and the fourth phase is 270 degrees.

The data signals generated by the data slicer circuitry 218 are output to the deserializer circuitry 222. The deserializer circuitry 222 converts the serial data signals to parallel signals and provides the parallel signal to other circuit elements within the communication system (e.g., the communication system 100).

Each data slicer 219 includes a corresponding offset compensation circuit 223. Each of the compensation circuits 223 compensates for mismatch within the corresponding data slicer 219 based on the control signal 232.

The error slicer circuitry 220 receives the equalized analog signal from the CTLE circuitry 216. The error slicer circuitry 220 generates error output signals by sampling the equalized analog signal. For example, the error slicer circuitry 220 generates the error output signals representative of the error voltage values EHP, ELP, EHN, and ELN by sampling the equalized analog signal and outputting a corresponding error output signal.

The error slicer circuitry 220 includes error slicers $221_1$-$221_N$. N is two or more. In one example, the error slicer circuitry 220 includes an error slicer for each error voltage value. For example, the error slicer circuitry 220 includes a first error slicer for the error voltage value EHP, a second error slicer for the error voltage value ELP, EHN, and ELN, a third error slicer for the error voltage value EHN, and a fourth error slicer for the error voltage value ELN.

In one example, a first error slicer (e.g., the error slicer $221_1$) of the error slicer circuitry 220 detects the error voltage level of EHP by sampling the equalized analog signal, a second error slicer (e.g., the error slicer $221_2$) of the error slicer circuitry 220 detects the voltage level of ELP by sampling the equalized analog signal, a third error slicer (e.g., the error slicer $221_3$) of the error slicer circuitry 220 detects the error voltage level EHN by sampling the equalized analog signal, and a fourth error slicer circuitry 220 (e.g., the error slicer $221_N$) detects the error voltage level ELN by sampling the equalized analog signal. Each error slicer outputs a respective error signal based on the detected voltage level The error signals generated by the error slicer circuitry 220 are output to the deserializer circuitry 224. The deserializer circuitry 224 converts the error signals from serial data signals to parallel signals.

Each error slicer 221 includes a corresponding offset compensation circuit 225. Each of the compensation circuits 225 compensates for mismatch within the corresponding error slicer 221 based on the control signal 232.

While the data slicer circuitry 218 and error slicer circuitry 220 are described with regard to a PAM4 receiver, in other examples, the data slicer circuitry 218 and the error slicer circuitry 220 are included in other types of receivers. For example, the data slicer circuitry 218 and error slicer circuitry 220 may be used within a NRZ or PAM-N receiver, where N is less than 4. In such receivers, the data slicer circuitry 218 includes one or data slicers 219. Each data slicer 219 detects a respective threshold reference and outputs a respective data signal to the deserializer circuitry 222. Further, in such examples, the error slicer circuitry 119 includes one or more error slicers 221. Each error slicer 221 detects a respective threshold reference and outputs a respective error signal to the deserializer circuitry 224.

The CDR adaptation circuitry 226 receives the output signal of the deserializer circuitry 222 and the deserializer circuitry 224. The CDR adaptation circuitry 226 generates a clock control signal 236 from the output signal provided by the deserializer circuitry 222 and the deserializer circuitry 224. The clock control signal 236 is output to the clock generator circuitry 228 to generate the clock signal 234.

Further, the CDR adaptation circuitry 226 generates a control signal 232 and a control signal 233. The control signal 232 is output to the offset compensation circuit 223 and 225 of each slicer 219, 221 and controls the offset compensation circuit of each slicer. The control signal 233 is output to the voltage DAC circuitry 229 and controls the voltage DAC circuitry 229 to generate the threshold reference voltages 235 for each data slicer and error slicer.

The voltage DAC circuitry 229 generates one or more threshold reference voltages 235 based on the control signal 233. For example, the voltage DAC circuitry 229 generates threshold reference voltages 235 for the data slicers 219 and the error slicers 221.

Figure 4:
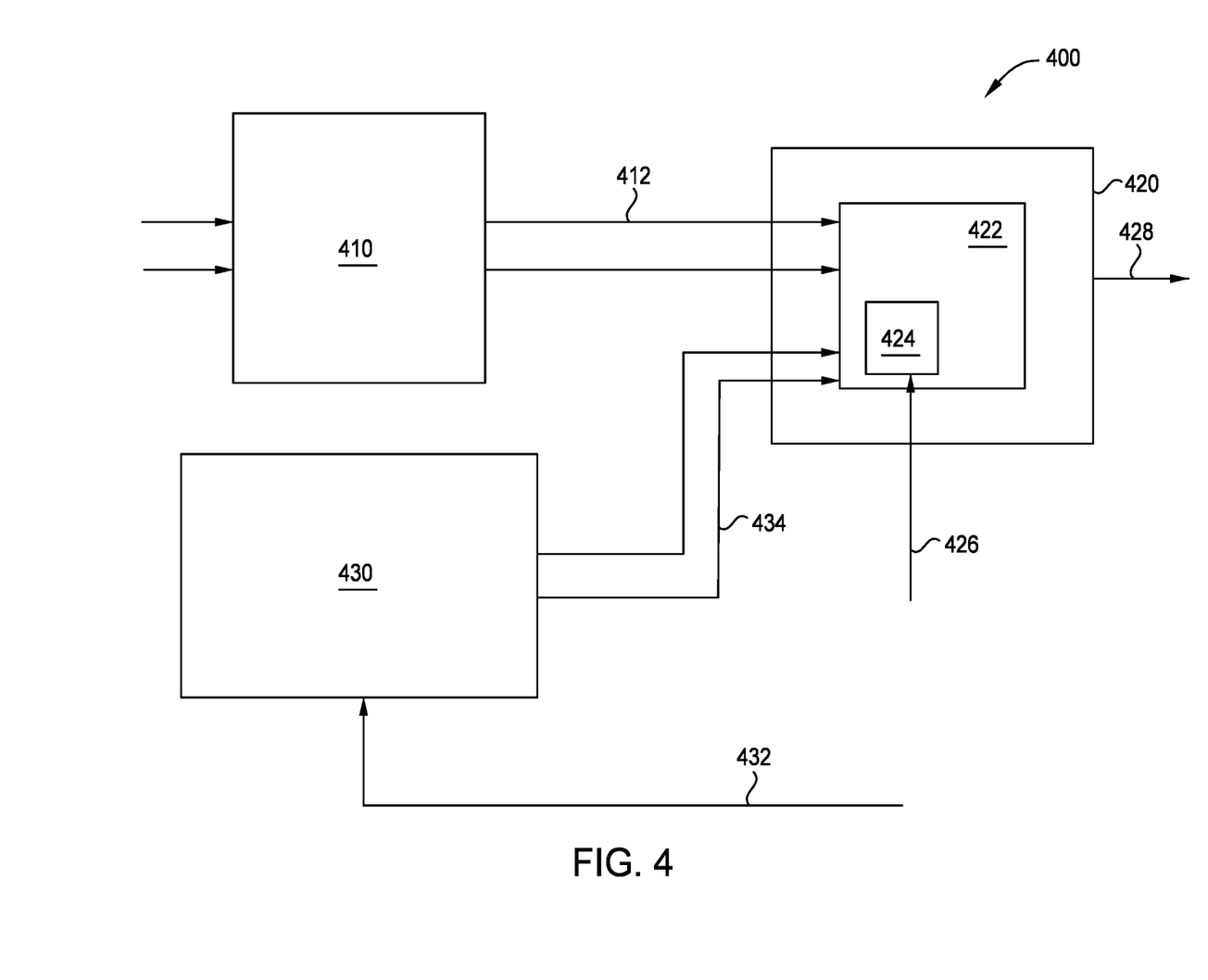
FIG. 4 is a block diagram of an example receiver circuitry, according to an example.

FIG. 4 illustrates a portion of receiver circuitry 400, according to one or more examples. The receiver circuitry 400 may be used within a NRZ receiver or a PAM-N receiver, where N is two or more. The receiver circuitry 400 includes CTLE circuitry 410, slicer circuitry 420, and voltage DAC circuitry 430. The CTLE circuitry 410 is configured similar to that of the CTLE circuitry 216 of FIG. 2. For example, the CTLE circuitry 410 receives an input signal and outputs an equalized analog signal 412 from the input signal similar to as described above with regard to the CTLE circuitry 216 of FIG. 2. The equalized analog signal 412 is a differential signal.

The voltage DAC circuitry 430 receives a control signal 432 and generates threshold reference voltages 434. The voltage DAC circuitry 430 is configured similar to the voltage DAC circuitry 229 of FIG. 2. The control signal 432 may be received from adaptation circuitry (e.g., the CDR adaptation circuitry 226 of FIG. 2). The control signal 432 instructs the voltage DAC circuitry 430 to select and output the threshold reference voltages 434.

The slicer circuitry 420 receives the equalized analog signal 412 from the CTLE circuitry 410 and the threshold reference voltages 434 from the voltage DAC circuitry 430. The slicer circuitry 420 includes a CapFF circuit 422. The CapFF circuit 422 may also be referred to as a slicer or a sampling circuit. The CapFF circuit 422 includes offset compensation circuit 424. The offset compensation circuit 424 compensates for mismatches within the CapFF circuit 422. The mismatches may be due to manufacturing tolerances within the circuit elements and routing within the CapFF circuit 422. The offset compensation circuit 424 receives a control signal 426 and adjusts the compensation applied to the CapFF circuit 422 based on the control signal 426. The control signal 426 may be provided by an adaptation circuit (e.g., the CDR adaptation circuitry 226 of FIG. 2). In one example, a capacitance value of the offset compensation circuit 424 is adjusted based on the control signal 426, varying the amount of compensation applied to the CapFF circuit 422.

The CapFF circuit 422 generates the data signal 428 based on the input signal, the threshold reference voltages 434, and the control signal 426. In one example, each of the data slicers 219 of the data slicer circuitry 218 and the error slicers 221 of the error slicer circuitry 220 is configured similar to the CapFF circuit 422. In such an example, each of the data slicers 219 and the error slicers 221 receives the equalized analog signal 412, a respective threshold reference voltage 434, and a respective control signal 426. Further, the data signal 428 is output to a deserializer circuit (e.g., the deserializer circuitry 222 or 224).

Figure 5:
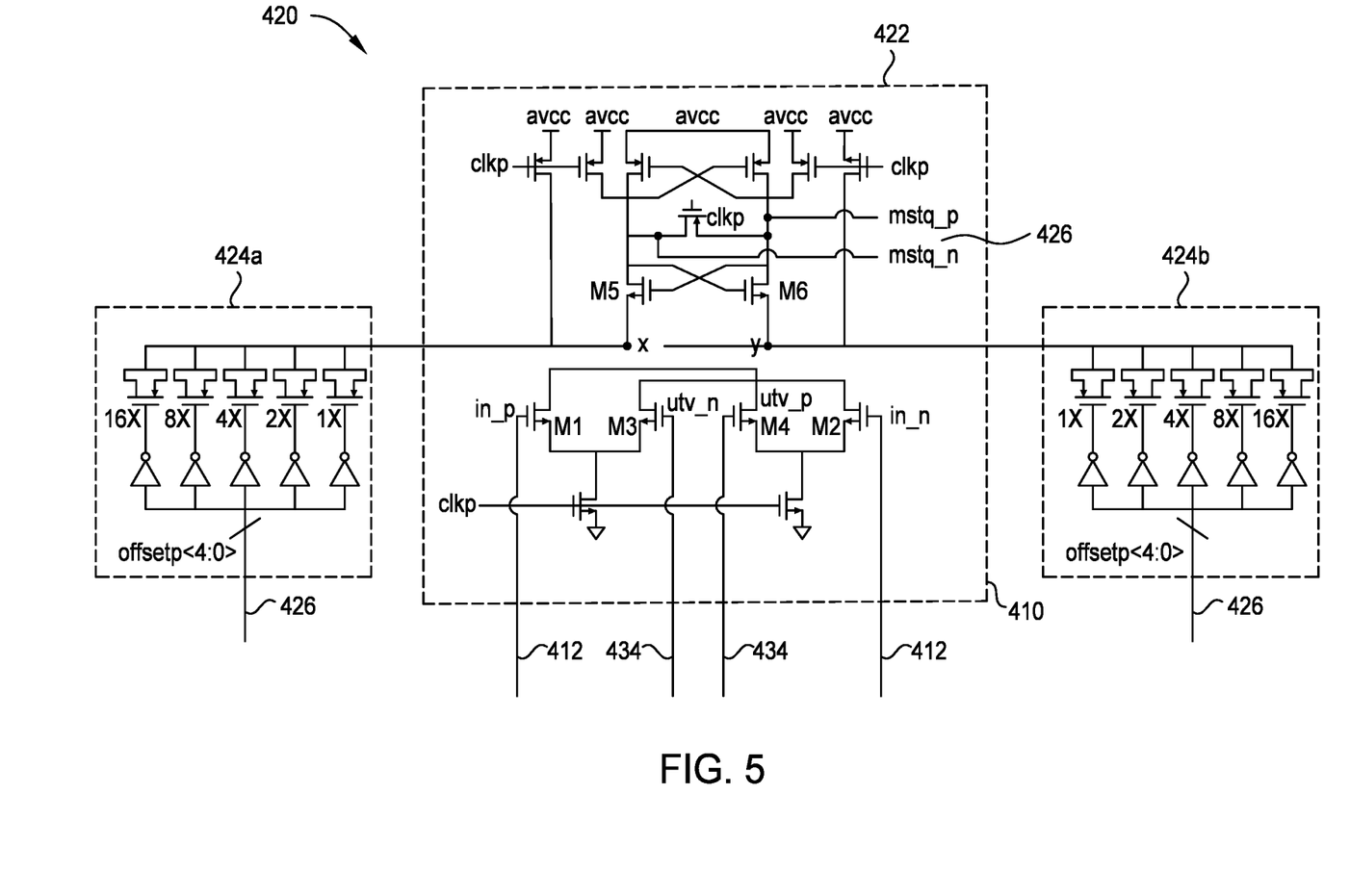
FIG. 5 is a schematic diagram of an example slicer circuitry, according to an example.

FIG. 5 illustrates a circuit level example of the slicer circuitry 420 including the CapFF circuit 422 and the offset compensation circuit 424, according to one or more examples. The CapFF circuit 422 includes a plurality of transistors configured to receive the threshold reference voltages 434. In one example, the threshold reference voltages 434 are signals utv_p and utv_n received at the gates of the transistors M3 and M4, respectively. The threshold reference voltages 434 set the reference voltage level of the CapFF circuit 422. Further, transistors M1 and M2 of the CapFF circuit 422 receive equalized analog signal 412 (e.g., an input signal). The equalized analog signal 412 is a differential signal received at the gates of the transistors M1 and M2. The equalized analog signal 412 includes signal in_p and in_n. Signal in_p has a positive polarity and the signal in_n has a negative polarity. The signal in_p is received by the gate of the transistor M1 and the signal in_n is received at the gate of the transistor M2. The CapFF circuit 422 outputs the data signal based on the reference voltage level, the offset value of the offset compensation circuit 424, and the equalized analog signal 412.

The data signal 428 is associated with a corresponding threshold voltage. For example, in a PAM4 receiver, the data signal 428 is associated with one of the threshold reference DH, the threshold reference DZ, the threshold reference DL, the error voltage level EHP, the error voltage level ELH, the error voltage level ELP, or the error voltage level ELN.

The offset compensation circuit 424 is configured to compensate for mismatches in the routing and circuit elements of the CapFF circuit 422. The mismatches may be due to manufacturing tolerances or other process tolerances. The amount of compensation applied by the offset compensation circuit 424 is based on the control signal 436.

The offset compensation circuit 424 includes CDAC 424a and CDAC 424b. The CDAC 424a applies compensation to the positive voltage side of the CapFF circuit 422 and the CDAC 424b applies compensation to the negative voltage side of the CapFF circuit 422. In one example, the CDACs 424a and 424b adjust a parasitic capacitance of the CapFF circuit 422 to compensate for mismatches in the CapFF circuit 422. The parasitic capacitance generated by the CDACs 424a and 424b may be the same, or one of the CDACs 424a and 424b may generate more parasitic capacitance the other.

Each of the CDAC 424a and the CDAC 424b include two or more capacitors. In one example, the CDACs 424a and 424b include five capacitors. In other examples, the CDACs 424a and 424b may include more or less than five capacitors. The capacitors may be PMOS capacitors. In other examples, capacitors other than PMOS capacitors may be used. The capacitors of the CDAC 424a and/or the CDAC 424b have a capacitance value of about 10 fF. In other examples, the capacitors of the CDAC 424a and/or the CDAC 424b have a capacitance value greater than about 10 fF or less than about 10 fF. In one or more examples, each of the capacitors within the CDACs 424a and 424b may have the same capacitance value. In another example, one or more the capacitors within the CDACs 424a or 424b has a capacitance value different from another one of the capacitors within the CDACs 424a or 424b.

The control signal 426 controls the capacitance value of each of the CDACs 424a and 424b. For example, the capacitors of the CDAC 424a are coupled to the output node of the CDAC 424a or decoupled to the output node of the CDAC 424a based on the control signal 426. Selectively coupling and decoupling the capacitors of the CDAC 424a, controls the capacitance value of the CDAC 424a and the parasitic capacitance introduced on the positive side (or positive portion) of the CapFF circuit 422. The capacitors of the CDAC 424b are coupled to the output node of the CDAC 424b or decoupled to the output node of the CDAC 424b based on the control signal 426. Selectively coupling and decoupling the capacitors of the CDAC 424b, controls the capacitance value of the CDAC 424b and the parasitic capacitance introduced on the negative side (negative portion) of the CapFF circuit 422.

In one example, the control signal 426 controls the CDAC 424a and CDAC 424b commonly, such that the control signal 426 alters the capacitance value of the CDAC 424a and 424b by the same amount. In such an example, the same control signal 426 is applied to the CDAC 424a and 424b. In another embodiment, the control signal 426 controls the CDAC 424a independently from the CDAC 424b. In such an embodiment, the capacitance value of the CDAC 424a may be altered independently from the capacitance value of the CDAC 424b. In such an example, more offset compensation may occur on one side (e.g., the positive side or negative side) of the CapFF circuit 422 than the other side, compensating for random mismatch within the CapFF circuit 422. In one example, the mismatch within the CapFF circuit 422 is in a range of about −30 mV to about 30 mV. In other examples, the mismatch within the CapFF circuit 422 is less than about −30 mV or greater than about 30 mV.

As the capacitance value of the CDACs 424a and 424b are varied, the parasitic capacitance present on one or more sides (e.g., the positive and negative sides) of the CapFF circuit 422 is varied. For example, increasing the capacitance value of the CDACs 424a or 424b increases the parasitic capacitance present on a corresponding side of the CapFF circuit 422. Decreasing the capacitance value of the CDACs 424a or 424b decreases the parasitic capacitance present on a corresponding side of the CapFF circuit 422.

The capacitance value of the CDACs 424a and 424b is determined based on an offset voltage within the CapFF circuit 422. In one example, adaptation circuitry (e.g., CDR adaptation circuitry 226) generates a control signal 426 indicating the capacitance value of the CDACs 424a and 424b. The offset voltage is determined based on the load difference at a node X and a node Y within the CapFF circuit 422. The node X is at the drain of transistor M1 and the node Y is at the drain of transistor M2. In one example, the offset voltage is determined based on $\Delta C = Cx - Cy$. $Cx$ and $CY$ are the capacitance loads at nodes X and Y. The load difference may change the trip point of the CapFF circuit 422. The trip point is the point at which the value of the data signal 416 toggles from a value of 0 to a value of 1 or from a value of 1 to a value of 0. The shift in the trip point is determined based on:

$$V_{OS} = \frac{I_d}{g_{m1}} \frac{\Delta C}{C_N} = \frac{V_{od1}}{2} \frac{\Delta C}{C_N}. \qquad \text{Equation 1.}$$

$C_N$ is the total load capacitance of the CapFF circuit 422, $I_d$ is the total current of the CapFF circuit 422, $g_{m1}$ is the total transconductance of the CapFF circuit 422, and $V_{od1}$ is the overdrive of the of the CapFF circuit 422.

Figure 6:
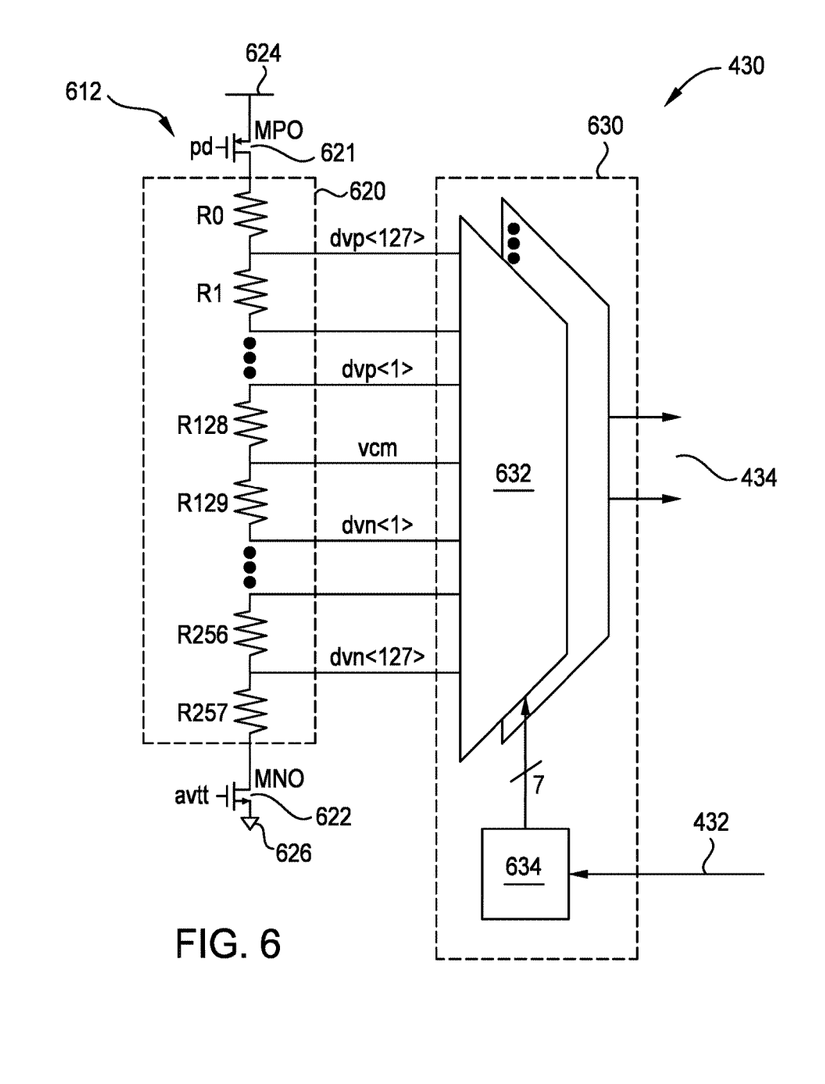
FIG. 6 is a schematic diagram of an example voltage digital-to-analog converter, according to an example.

FIG. 6 illustrates an example implementation of the voltage DAC circuitry 430, according to one or more examples. The voltage DAC circuitry 430 generates the threshold reference voltages 434 for the CapFF circuit 422. In one example, the voltage DAC circuitry 430 generates threshold reference voltages 434 for the CapFF circuits (slicers) of the corresponding receiver circuitry. In one example, the voltage DAC circuitry 430 generates threshold reference voltages 434 for each data slicer and error slicer within the corresponding receiver circuitry as differential voltages. For example, with reference to a PAM4 receiver, the voltage DAC circuitry 430 generates the differential voltages dh_n and dh_p for a data error slicer configured to generate a data signal associated with threshold reference voltage DH, and the differential voltages dl_n and dl_p for a data slicer configured to generate a data signal associated with threshold reference voltage DL. Further, the voltage DAC circuitry 430 generates the differential voltages ehp_n and ehp_p for an error slicer configured to generate an error signal associated with the error voltage value EHP, the differential voltages elp_n and elp_p for an error slicer configured to generate an error signal associated with the error voltage value ELP, the differential voltages ehn_n and ehn_p for an error slicer configured to generate an error signal associated with the error voltage value EHN, and the differential voltages eln_n and eln_p for an error slicer configured to generate an error signal associated with the error voltage value ELN.

The differential voltages dh_n and dh_p correspond to threshold voltage reference Vdh, the differential voltages dl_n and dl_p correspond to threshold voltage reference Vdl, the differential voltages ehp_n and ehp_p correspond to threshold voltage reference Vehp, the differential voltages elp_n and elp_p correspond to threshold voltage reference Velp, the differential voltages ehn_n and ehn_p correspond to threshold voltage reference Vehn, and the differential voltages eln_n and eln_p correspond to the threshold voltage reference Veln. Further, when the threshold reference voltage 434 is used to communicate the threshold voltage reference Vdh, the threshold reference voltage 434 communicates the differential voltages dh_n and dh_p. The threshold voltage reference Vdz corresponds to a common voltage having a differential of 0 volts. The threshold reference voltages Vdh, Vdl, Vehp, Vehn, Velp, and Veln are communicated as the threshold voltage reference 434 as differential voltages.

The voltage DAC circuitry 430 includes voltage divider 612 and multiplexer circuitry 630. The voltage divider 612 includes a resistor string 620, transistors 621 and 622. The voltage divider 612 is an open-loop voltage divider. The transistor 621 functions as a switch to control the power state of the voltage divider 612, and the transistor 622 matches the transistor 621 such that the middle point (e.g., middle voltage of the voltage divider) of the voltage divider 612 is a common voltage, $V_{cm}$.

The resistor string 620 includes a plurality of resistors. In one example, the resistor string includes 258 discrete resistors. In other example, the resistor string 620 include more than or less than 258 discrete resistors. The resistors R1 through R256 form the internal region of the resistor string 620. The resistors R1 through R256 have the same resistance value. For example, each of the resistors R1 through R256 has a resistance value of about 7 ohms. In other examples, the resistance of the resistors R1 through R256 have a resistance value of less then or greater than 7 ohms. In one example, the resistors R1 through R256 are identical parasitic metal resistors.

The resistors R0 and R257 limit the current through the voltage divider 612. Limiting the current through the voltage divider 612, increases the resolution of each of the resistors R1 to R256. The resistors R0 and R257 have a resistance value greater than that of the resistors R1 through R256. In one example, the resistance value of the resistors R0 and R257 is the same. In another example, one of the resistors R0 and R257 has a resistor value greater than another resistor. The resistors R0 and R257 have a resistance value of about 2 KOhms. In another example, at least one of the resistors R0 and R257 have a resistance value of greater than or less than about 2 KOhms. The resistors R0 and R257 may be HiR resistors having a high sheet resistance based on area to limit the direct current (DC) current through the voltage divider 612. For example, the DC current may be about 180 uA. In other examples, the DC current may be greater than or less than 180 uA.

The voltages are generated at tap points between adjacent resisters of the resistors R0-R257. The resistors of the resistor string 620 generate the positive voltages dvp<1> through dvp<127>, common voltage Vcm, and negative voltages dvn<1> through dvn<127>. While the resistor string 620 generates 128 voltages, in other examples, the resistor string 620 may generate more than or less than 128 voltages. The number of generated voltages corresponds to the number of resistors within the resistor string 620 and the selected tap points between the resistors. Increasing or decreasing the number of resistors within the resistor string 620 and/or the number of tap points, the number of generated of voltages may be increased or decreased.

The polarity of the voltages is referenced to the common voltage Vcm. In one example, the magnitude of the voltages dvp<1> and dvn<1> is less than the magnitude of the voltages dvp<127> and dvn<127>. The magnitude of the voltages gradually increases between voltage vcm and voltage dvp<127> and between voltage Vcm and voltage dnv<127>.

In one example, the voltage across each resistor of the resistor string 620 is the same. In another example, the voltage across one or more of the resistors of the resistor string differs from that of another resistor. The voltage across each of the resistors R1 through R256 of the internal region of the resistor string 620 is about 1.2 mV. Stated another way, each of the resistors R1 through R256 of the internal region of the resistor string 620 generates a 2.4 mV step differential. In one example, with voltage divider 612 has 128 steps (e.g., 7 bits), providing about a +/−300 mV range within the output voltages. In other examples, the voltage across each of the resistors R1 through R256 may be greater than or less than 1.2 mV and is based on the resistance value of the resistors. Further, the number of steps may be greater than or less than 128 (e.g., greater than or less than 7 bits) and is based on the number of resistors within the resistor string 620 and the number of tap points used. Further, the voltage range may be greater than or less than +/−300 mV. The voltage drop between resistors R0 and R1 is about 360 mV and the voltage drop between the resistors R256 and R257 is about 360 mV. In other examples, the voltage drop between the resistors R0 and R1 may be greater than or less about 360 mV, and the voltage drop between the resistors R256 and R257 is less than or greater than 360 mV.

Each voltage generated by the resistor string 620 is associated with a code. The codes may be used by the multiplexer circuitry 630 to select the voltages generated by resistor string 620 based on the control signal 432.

The resistor string 620 is connected to the multiplexer circuitry 630. The multiplexer circuitry 630 selects pairs of voltages from the voltages generated by the resistor string 620 to be output as the first and second differential voltages of the threshold reference voltages 434. The multiplexer circuitry 630 selects the pairs of voltages based on the control signal 432. The multiplexer circuitry 630 includes two or more multiplexers 632. In one example, the multiplexer circuitry 630 includes a multiplexer 632 for each threshold reference voltage. In one example, for a PAM4 receiver, to generate the differential voltages dh_n and dh_p, dl_n and dl_p, ehp_n and ehp_p, elp_n and elp_p, ehn_n and ehn_p and eln_n and eln_p, the multiplexer circuitry 630 includes six multiplexers 632. In another example, for a NRZ receiver, the multiplexer circuitry 630 includes two or more multiplexers 632 to generate the corresponding data and error reference voltages. The multiplexers 632 may be grouped in pairs, such that a first multiplexer of each pair selects a positive voltage from the resistor string 620 and a second multiplexer of each pair selects a negative voltage from the resistor string 620.

Each multiplexer 632 is a 128-to-1 multiplexer. In other examples, the multiplexers 632 may be greater than or less than a 128-to-1 multiplexer. Further, the ratio of the multiplexers 632 is based on the voltages generated by the voltage divider 612. For example, if the voltage divider 612 generates more than 128 voltages, the ratio of the multiplexers 632 is greater than 128-to-1, and if the voltage divider 612 generates less than 128 voltages, the ratio of the multiplexers 632 is less than 128-to-1.

The multiplexers 632 select the voltage pairs making up the threshold reference voltages 434 based on the control signal 432. The control signal 432 provides an indication to each of the multiplexers 632 as to which voltage generated by the resistor string 620 to select and output. The control signal 432 includes a code indicating each voltage output by the resistor string 620 that is to be selected.

The control signal 432 is received by and decoded by the decoder circuit 634. In one example, the multiplexers 632 are grouped in pairs such that for each threshold reference voltage, two multiplexers 632 are assigned. A first multiplexer 632 of the pair selects a positive voltage and a second multiplexer of the pair selects a negative voltage. Each pair of the multiplexers 632 shares a decoder circuit 634. The decoder circuit 634 may be a binary decoder or another type of decoder. The number of bits within the decoder circuit 634 corresponds to the number of voltages generated by the voltage divider 612. In one example, the size of the decoder circuit 634 is 7 bits. In another example, the size of the decoder circuit 634 is greater than or less than 7 bits. The decoder circuit 634 receives the control signal 432 and generates a first code corresponding to a positive voltage and a second code corresponding to a negative voltage. The first code is output to a first multiplexer of a first pair multiplexers, and the second code is output to a second multiplexer of the first pair of multiplexers. Each of the first and second multiplexers selects a voltage from the resistor string 620 based on the first and second codes.

In one example, each multiplexer 632 of each pair of multiplexers receives a code corresponding to a positive or negative voltage, instructing each multiplexer 632 which voltage generated by the resistor string 620 to select. In one example, the decoder circuit 634 decodes the control signal 432 and outputs a code of 0. A code of 0 corresponds to a 0 differential and instructs each multiplexers 632 of a pair of multiplexers to select the common voltage $V_{cm}$. In another example, the decoder circuit 634 generates a code of 127 from the control signal 432. The code of 127 is output to a first multiplexer 632 of a first pair of multiplexers selects the voltage dvp<127> and a second multiplexer 632 of the first pair of multiplexers selects voltage dvn<127>.

In one example, each pair of the multiplexers 632 selects corresponding voltages from the resistor string 620 based on codes decoded by the decoder circuit 634 during non-overlapping periods. In other examples, two or more of the pairs of the multiplexers 632 selects voltages from the resistor string 620 based on codes decoded by the decoder circuit 634 during at least partially overlapping periods.

FIGS. 4-6 describe exemplary receiver circuitry 400 where the offset compensation is performed by offset compensation circuit (e.g., the offset compensation circuit 424) within each CapFF circuit (e.g., CapFF circuit 422), and the threshold reference voltages are generated by a voltage DAC circuit (e.g., the voltage DAC circuitry 430). An offset compensation circuit is associated with each CapFF circuit, and offset compensation is performed within each CapFF circuit independently from each other CapFF circuit. Accordingly, offset compensation is not performed on each threshold reference voltages before being provided to the CapFF circuit. Accordingly, the threshold voltage references may be shared by two or more slicers (e.g., data slicers associated with different clock phases). In a receiver multiple data slicers and error slicers, providing the same threshold voltage references to two or more data slicers reduces the number of generated threshold voltage references as compared to generating a threshold voltage for each data and/or error slicer independently. Accordingly, the circuitry of such a receiver may be simplified as compared to other receivers, e.g., DAC-FARM and I2V circuits may be omitted, reducing the circuit area and power requirements of the corresponding receiver circuitry.

Figure 7:
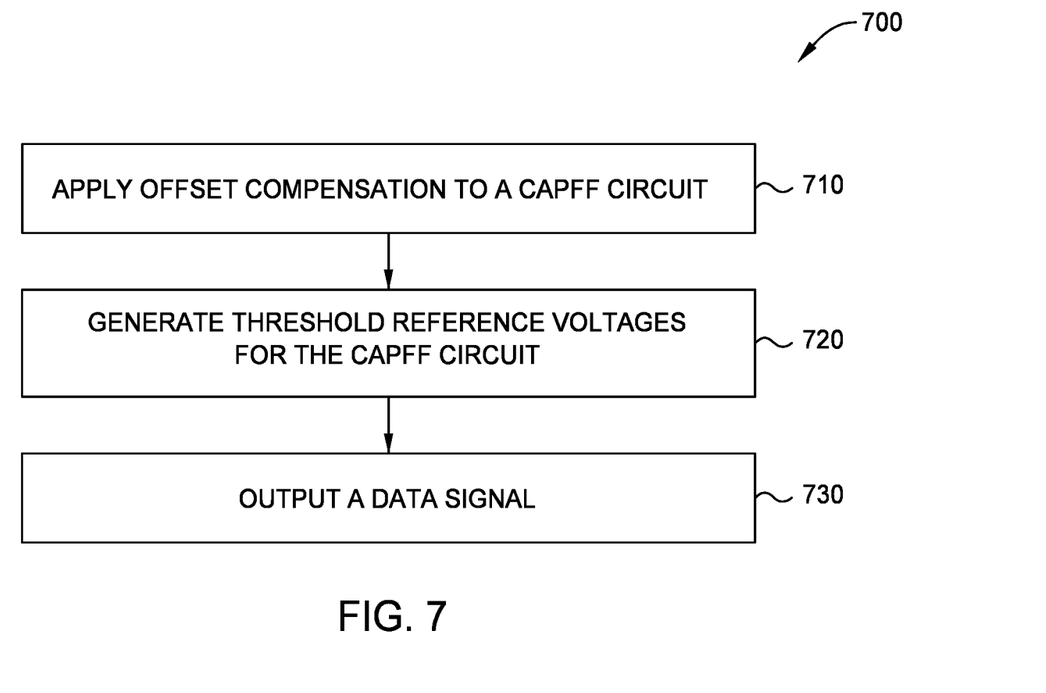
FIG. 7 is a flowchart of a method for processing a data signal, according to an example.

FIG. 7 illustrates a flowchart of a method 700 for operating receiver circuitry, according to one or more examples. The receiver circuitry may part of a NRZ receiver or a PAM-N receiver, where N is two or more. At block 710 offset compensation is applied to a CapFF circuit (e.g., a slicer). In one example, the offset compensation circuit 424 applies compensation to the CapFF circuit 422. The offset compensation circuit 424 receives the control signal 426 and adjusts the capacitance of the CDAC 424a and/or 424b to adjust a corresponding parasitic capacitance of the CapFF circuit 422, compensating for mismatches within the CapFF circuit 422. In one example, adaptation circuitry (e.g., the CDR adaptation circuitry 226 of FIG. 2) generates the control signal 426 at power on or reset of the receiver circuitry 400. The adaptation circuitry continues to send the control signal to adjust the compensation applied by the offset compensation circuit 424 until the output of the CapFF circuit 422 changes value (e.g., from a 0 to 1 or 1 to 0), or the output of the CapFF circuit 422 is a value of 0 about fifty percent of the time and a value of 1 about fifty percent of the time. In a receiver circuitry that includes more than CapFF circuit, the compensation circuit for each CapFF circuit is independently adjusted during non-overlapping periods. In other embodiments, two or more compensation circuits for two or more respective CapFF circuits may be adjusted during an at least partially overlapping period.

At block 720, threshold reference voltages are generated for the CapFF circuit. For example, the voltage DAC circuitry 430 generates the threshold reference voltages for the CapFF circuit 422 based on the control signal 432. In one example, the decoder circuit 634 generates one or more codes from the control signal 432. The one or more codes are output to a first multiplexer 632 and the second multiplexer 632. In one example, the codes are generated by the CDR adaptation circuitry 226 of FIG. 2 based on the output of the deserializer circuitry 222 of FIG. 2 and/or the deserializer circuitry 224 of FIG. 2.

The first multiplexer 632 selects a first voltage from the resistor string 620 of the voltage divider 612 and outputs a first differential voltage for a first threshold reference voltage based on the one or more codes. The second multiplexer 632 selects a second voltage from the resistor string 620 of the voltage divider 612 and outputs a second differential voltage for the first threshold reference voltage based on the one or more codes. The first and second differential voltages are output the CapFF circuits 422 as the threshold reference voltage. In one example, the first and second differential voltages are output to two or more CapFF circuits. For example, the first and second differential voltages are output to a CapFF circuit associated with each different clock phase.

An adaptation circuitry (e.g., the CDR adaptation circuitry 226) generates the control signal 432. The adaptation circuitry may generate a different control signal for each threshold reference voltage to be generated. The adaptation circuitry generates the control signal 432 based on the completion of the offset compensation of each slicer (e.g., CapFF circuit). In one example, the control signal 432 is generated during the operation of the corresponding receiver circuitry. In one example, with reference to FIG. 2, the CDR adaptation circuitry 226 generate the control signal 432 based on the output of the deserializer circuitry 222 and/or the deserializer circuitry 224.

In the above, a CapFF circuit (or slicer) includes a corresponding offset compensation circuit. The offset compensation circuit mitigates mismatch within the corresponding CapFF circuit. Including the offset compensation circuit within the CapFF circuit allows for independent adjustment of each CapFF circuit and the use of a voltage DAC circuit to generate the threshold reference voltage for each CapFF circuit. Accordingly, as compared to other receiver circuitry designs, receiver circuitry as described above has reduced power and circuit area requirements.

While the foregoing is directed to specific examples, other and further examples may be devised without departing from the basic scope thereof, and the scope thereof is determined by the claims that follow.

What is claimed is:

1. Receiver circuitry for a communication system, the receiver circuitry comprising:
    signal processing circuitry configured to receive a data signal and generate a processed data signal;
    voltage digital-to-analog converter (DAC) circuitry configured to generate a first threshold reference voltage; and
    slicer circuitry coupled to an output of the signal processing circuitry, the slicer circuitry comprising:
        a first capture flip-flop (CapFF) circuit configured to receive the processed data signal and the first threshold reference voltage and generate a first data signal, wherein the first CapFF circuit comprises a first offset compensation circuit comprising a first capacitor DAC (CDAC) connected to a first node of the first CapFF circuit and configured to apply a first parasitic capacitance to the first node, and a second CDAC connected to a second node of the first CapFF circuit and configured to apply a second parasitic capacitance to the second node.

2. The receiver circuitry of claim 1, wherein the voltage DAC circuitry comprises:
    a voltage divider circuit configured to generate a plurality of voltages; and
    multiplexer circuitry coupled to the voltage divider circuit and configured to output the first threshold reference voltage based on the plurality of voltages.

3. The receiver circuitry of claim 2, wherein the multiplexer circuitry comprises:
    a first multiplexer configured to select a first voltage of the plurality of voltages, and output the first voltage as a first differential voltage of the first threshold reference voltage; and
    a second multiplexer configured to select a second voltage of the plurality of voltages and output the second voltage as a second differential voltage of the first threshold reference voltage.

4. The receiver circuitry of claim 1, wherein the first CDAC is further configured to increase the first parasitic capacitance based on a first control signal, and the second CDAC is further configured to increase the first parasitic capacitance based on a second control signal.

5. The receiver circuitry of claim 1, the first parasitic capacitance differs from the second parasitic capacitance.

6. The receiver circuitry of claim 1, wherein the voltage DAC circuitry is further configured to generate a second threshold reference voltage, and wherein the slicer circuitry further comprises a second CapFF circuit configured to receive the processed data signal and the second threshold reference voltage, wherein the second CapFF circuit comprises second offset compensation circuit configured to adjust a parasitic capacitance of the second CapFF circuit.

7. The receiver circuitry of claim 1, wherein the slicer circuitry further comprises a second CapFF circuit configured to receive the processed data signal and the first threshold reference voltage, wherein the second CapFF circuit comprises a second offset compensation circuit configured to adjust a parasitic capacitance of the second CapFF circuit.

8. A communication system comprising:
    transmitter circuitry configured to transmit a data signal; and
    receiver circuitry connected to the transmitter circuitry via a channel, the receiver circuitry comprising:
        signal processing circuitry configured to receive the data signal and generate a processed data signal;
        voltage digital-to-analog converter (DAC) circuitry configured to generate a first threshold reference voltage; and
        slicer circuitry coupled to an output of the signal processing circuitry, the slicer circuitry comprising:
            a first capture flip-flop (CapFF) circuit configured to receive the processed data signal and the first threshold reference voltage and generate a first data signal, wherein the first CapFF circuit comprises a first offset compensation circuit comprising a first capacitor (CDAC) connected to a first node of the first CapFF circuit and configured to apply a first parasitic capacitance to the first node, and a second CDAC connected to a second node of the first CapFF circuit and configured to apply a second parasitic capacitance to the second node.

9. The communication system of claim 8, wherein the voltage DAC circuitry comprises:
a voltage divider circuit configured to generate a plurality of voltages; and
multiplexer circuitry coupled to the voltage divider circuit and configured to output the first threshold reference voltage based on the plurality of voltages.

10. The communication system of claim 9, wherein the multiplexer circuitry comprises:
a first multiplexer configured to select a first voltage of the plurality of voltages, and output the first voltage as a first differential voltage of the first threshold reference voltage; and
a second multiplexer configured to select a second voltage of the plurality of voltages and output the second voltage as a second differential voltage of the first threshold reference voltage.

11. The communication system of claim 8, wherein the voltage DAC circuitry is further configured to generate a second threshold reference voltage, and wherein the slicer circuitry further comprises a second CapFF circuit configured to receive the processed data signal and the second threshold reference voltage, wherein the second CapFF circuit comprises second offset compensation circuit configured to adjust a parasitic capacitance of the second CapFF circuit.

12. The communication system of claim 8, wherein the slicer circuitry further comprises a second CapFF circuit configured to receive the processed data signal and the first threshold reference voltage, wherein the second CapFF circuit comprises second offset compensation circuit configured to adjust a parasitic capacitance of the second CapFF circuit.

13. A method for operating receiver circuitry, the method comprising:
receiving a data signal and generating a processed data signal from the data signal;
generating, via a voltage-to-analog convertor (DAC) circuitry, a first threshold reference voltage;
receiving, at a first CapFF circuit the processed data signal and the first threshold reference voltage;
applying, via a first capacitor DAC (CDAC) of a first offset compensation circuit of the first CapFF circuit, a first parasitic capacitance to a first node of the first CapFF circuit;
applying, via a second CDAC of the first offset compensation circuit, a second parasitic capacitance to a second node of the first CapFF circuit; and
generating an output signal from the processed data signal.

14. The method of claim 13 further comprising:
generating, via a voltage divider, a plurality of voltages; and
outputting, via multiplexer circuitry, the first threshold reference voltage based on the plurality of voltages.

15. The method of claim 14, wherein outputting the first threshold reference voltage comprises:
selecting, via a first multiplexer of the multiplexer circuitry, a first voltage of the plurality of voltages and output the first voltage as a first differential voltage of the first threshold reference voltage; and
selecting, via a second multiplexer of the multiplexer circuitry, a second voltage of the plurality of voltages and output the second voltage as a second differential voltage of the first threshold reference voltage.

16. The method of claim 13 further comprising:
generating, via the voltage DAC circuit, a second threshold reference voltage;
receiving, at a second CapFF circuit, the processed data signal and the second threshold reference voltage; and
adjusting, via a second offset compensation circuit of the second CapFF circuit, a parasitic capacitance of the second CapFF circuit.

17. The method of claim 13 further comprising:
receiving, at a second CapFF circuit, the processed data signal and the first threshold reference voltage; and
adjusting, via a second offset compensation circuit of the second CapFF circuit, a parasitic capacitance of the second CapFF circuit.

\* \* \* \* \*